(12) United States Patent
Compton et al.

(10) Patent No.: US 12,032,009 B2
(45) Date of Patent: Jul. 9, 2024

(54) WIDEBAND RF SPECTRUM REAL-TIME MONITOR

(71) Applicant: Honeywell International Inc., Charlotte, NC (US)

(72) Inventors: Robert Compton, Loretto, MN (US); Karl D. Nelson, Plymouth, MN (US); Neal Eldrich Solmeyer, Edina, MN (US); Matthew Wade Puckett, Phoenix, AZ (US)

(73) Assignee: Honeywell International Inc., Charlotte, NC (US)

( * ) Notice: Subject to any disclaimer, the term of this patent is extended or adjusted under 35 U.S.C. 154(b) by 507 days.

(21) Appl. No.: 17/350,901

(22) Filed: Jun. 17, 2021

(65) Prior Publication Data

US 2022/0276293 A1    Sep. 1, 2022

Related U.S. Application Data

(60) Provisional application No. 63/044,753, filed on Jun. 26, 2020.

(51) Int. Cl.
*G01R 29/08*  (2006.01)
(52) U.S. Cl.
CPC .............................. *G01R 29/0885* (2013.01)
(58) Field of Classification Search
CPC ............ G01R 29/0885; G01R 29/0892; G01R 29/0878; G01R 33/26; G01R 33/032;

(Continued)

(56) References Cited

U.S. PATENT DOCUMENTS 4,024,396 A    5/1977  Hill et al.
7,450,618 B2 *  11/2008  Dantus ............... G01N 21/6402
                                                    372/27

(Continued)

FOREIGN PATENT DOCUMENTS

EP          3605130 A1 *  2/2020  ............. G01R 33/26
WO     2016205330 A1    12/2016

OTHER PUBLICATIONS

Bui, Lam Anh, "Recent Advances in Microwave Photonics Instantaneous Frequency Measurements", Progress in Quantum Electronics, vol. 69, 2020 100237, pp. 1 through 13, Available online Nov. 7, 2019, 0079-6727/ Crown Copyright c 2019 Published Elsevier Ltd.

(Continued)

*Primary Examiner* — Michael P Stafira
(74) *Attorney, Agent, or Firm* — Fogg & Powers LLC

(57) ABSTRACT

A sensor system comprises a laser source that emits a pump beam at a first wavelength and a probe beam at a second wavelength, and an optical means for receiving the pump and probe beams. The optical means is operative to generate a plurality of light beams, each having a different frequency, from the pump and probe beams. One or more cells receive the light beams from the optical means and allow passage of the light beams therethrough, with the cells containing alkali atoms. A dichroic filter is configured to receive the light beams from the cells. The dichroic filter separates pump beam light and probe beam light from the light beams. A detector array receives the probe beam light from the dichroic filter. The detector array includes a two-dimensional array of photosensors that map out transmission of respective light beams corresponding to the probe beam light through the cells.

18 Claims, 9 Drawing Sheets

(58) Field of Classification Search
CPC .............. G01R 29/10; G01R 33/0094; G01R 33/0052; G01R 29/0821; G01R 33/10; G01R 23/17; G01R 29/0864; G01R 33/24; G01R 33/441; G01R 23/16; G01R 33/0029; G01R 33/02; G01R 33/038; G01R 33/1284; G01R 33/20
See application file for complete search history.

(56) References Cited

U.S. PATENT DOCUMENTS

| | | | |
|---|---|---|---|
| 8,675,699 B2* | 3/2014 | Dantus | G01J 11/00 372/25 |
| 8,861,567 B2* | 10/2014 | Li | G01R 23/17 398/115 |
| 9,995,800 B1 | 6/2018 | Schwindt et al. | |
| 10,274,549 B1 | 4/2019 | Ledbetter et al. | |
| 10,802,066 B1 | 10/2020 | Keaveney et al. | |
| 10,979,147 B2 | 4/2021 | Gordon et al. | |
| 11,002,777 B2* | 5/2021 | Salim | G01R 29/0885 |
| 2003/0137719 A1* | 7/2003 | Van Der Veer | G02F 1/39 359/332 |
| 2016/0202062 A1* | 7/2016 | Griffith | G01C 19/62 324/304 |
| 2016/0363617 A1 | 12/2016 | Anderson et al. | |
| 2018/0348313 A1 | 12/2018 | Bulatowicz et al. | |
| 2019/0187198 A1 | 6/2019 | Anderson et al. | |
| 2020/0233025 A1* | 7/2020 | Salim | G01R 29/0885 |
| 2020/0292606 A1 | 9/2020 | Holloway et al. | |

OTHER PUBLICATIONS

European Patent Office, "Extended European Search Report from EP Application No. 21181908.1-1213", from Foreign Counterpart to U.S. Appl. No. 17/350,901, Nov. 12, 2021, pp. 1 through 8, Published: EP.

European Patent Office, "Communication pursuant to Article 94(3)", from EP Application No. 21181908.1, from Foreign Counterpart to U.S. Appl. No. 17/350,901, Jun. 2, 2023, pp. 1 through 6, Published: EP.

Anderson et al., "Rydberg atoms for radio-frequency communications and sensing: atomic receivers for pulsed RF field and phase detection", Oct. 17, 2019, pp. 1 through 10.

Fan et al., "Atom based RF electric field sensing", Journal of Physics B: Atomic, Molecular and Optical Physics 48, 202001 (2015), 202001, Sep. 9, 2015, pp. 1 through 17, IOP Publishing Ltd.

Grimmel et al., "Measurement and numerical calculation of Rubidium Stark spectra", New J. Phys. 17, (2015) 053005, May 6, 2015, pp. 1 through 9, IOP Publishing Ltd.

Hu et al., "Reconfigurable electro-optic frequency shifter", May 19, 2020, pp. 1 through 12.

Merkel, "20 GHz Instantaneous Bandwidth RF Spectrum Analyzer Measurements with high Sensitivity and Spur Free Dynamic Range", GOMACTech2014 Conference paper, Mar. 2014, pp. 1 through 4, Charleston, SC.

Meyer et al., "Assessment of Rydberg atoms for wideband electric field sensing", J. Phys. B At. Mol. Opt. Phys 53, 034001 (2020), Jan. 10, 2020, pp. 1 through 16.

Meyer et al., "Digital communication with Rydberg atoms and amplitude-modulated microwave fields", Appl. Phys. Lett. 112, 211108 (2018), Oct. 29, 2018, pp. 1 through 10.

S2 Corporation, "Spectrum Analyzer", at least as early as Aug. 31, 2020, pp. 1 through 8.

Zou et al., "Atomic Receiver by Utilizing Multiple Radio-Frequency Coupling at Rydberg States of Rubidium", Applied Science 2020, 10, 1346, Feb. 16, 2020, pp. 1 through 8, MDPI, www.mdpi.com/journal/applsci.

* cited by examiner

WIDEBAND RF SPECTRUM REAL-TIME MONITOR

CROSS REFERENCE TO RELATED APPLICATION

This application claims the benefit of and priority to U.S. Provisional Application No. 63/044,753, filed on Jun. 26, 2020, which is herein incorporated by reference.

BACKGROUND

A central problem of electronic warfare is the interception or detection of radio-frequency (RF) signals transmitted by unfriendly operators. These operators may attempt to reduce the probability of interception by transmitting very faint signals, or by hopping around in frequency, or by spreading their signals across a wide bandwidth. In order to detect these signals, therefore, it is necessary to monitor a wide (greater than 20 GHz) band of the RF spectrum in real-time and with high-sensitivity, dynamic range, and frequency resolution.

Electronic warfare is a growing threat, not only in the area of covert communications, but also in navigation, where jamming and spoofing of Global Positioning System (GPS) and other navigation signals, threaten freedom of movement of defense assets. Spectrum monitoring and analysis could be an important part of the solution to the denial and degradation of GPS signals.

The extremely high sensitivity of Rydberg atoms to electric fields has led to interest in using them as RF field sensors to replace the antenna and front end of a radio receiver. So far, however, the strengths of the Rydberg electrometer have not given it a clear advantage given the accompanying challenges.

In particular, there is increasing interest in using Rydberg electrometers in wide bandwidth applications, using the ability to address multiple Rydberg levels. These properties would be useful in fast spectrum scanning and ultrawide-bandwidth communication if the discrete nature of the frequency sensitivity could be overcome.

SUMMARY

A sensor system comprises a laser source configured to emit a pump beam at a first wavelength and a probe beam at a second wavelength, and an optical means for receiving the pump beam and probe beam from the laser source. The optical means is operative to generate a plurality of light beams, each having a different frequency, from the pump beam and the probe beam. One or more cells are configured to receive one or more of the light beams from the optical means and to allow passage of the one or more light beams therethrough, the one or more cells containing a plurality of alkali atoms. A dichroic filter is configured to receive the one or more light beams from the one or more cells. The dichroic filter is operative to separate pump beam light and probe beam light from the one or more light beams. A detector array is configured to receive the probe beam light from the dichroic filter. The detector array includes a two-dimensional array of photosensors operative to map out transmission of respective light beams corresponding to the probe beam light through the one or more cells.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

Figure 1A:
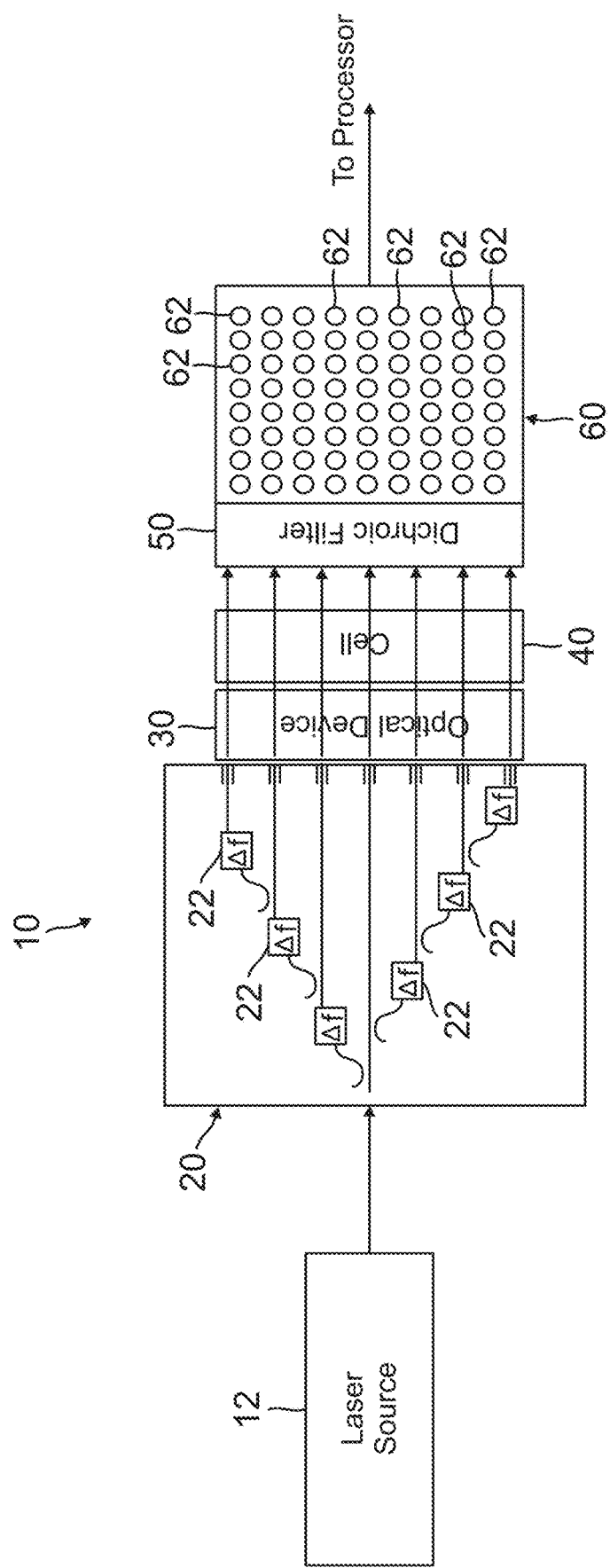
FIG. 1A is a schematic diagram of a sensor system, according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A wideband radio-frequency (RF) spectrum real-time monitoring sensor system is described herein. The present sensor system is based on atoms that are excited to a manifold of so-called "Rydberg" states when prepared by appropriate wavelengths of laser light. Within this manifold of Rydberg states, individual states can be selected and probed in which the atoms are sensitive to particular frequencies of RF emission.

In one implementation, the sensor system is a Rydberg spectrum analyzer that employs an array of Rydberg probes, which provide for monitoring to continuously map a 20 GHz swath of the RF spectrum, with each Rydberg probe tuned to a slightly different RF frequency. A single probe can span about 100 MHz along the RF spectrum by the application of a small electric field (e.g., less than 1 V/cm). In addition, many probes in an array can address different Rydberg levels. For example, the total sensed range of RF frequencies can be extended to about 20 GHz with about 200 probes. Electrodes can be fabricated as part of a package to deliver highly controlled electric fields.

In some embodiments, fabricating a large number of parallel array probes for the sensor system involve the use of integrated photonics. For example, a photonic-integrated pump/probe delivery array is described hereafter. In other embodiments, the integrated photonics can be replaced with a fiber based system, as described further below.

The present sensor system can achieve a simultaneous readout of the 100 MHz range around each Rydberg level by applying an electric field gradient and spatially discriminating the probe beams along the electric field gradient.

A Rydberg electrometer can be thought of as a "ladder"-type Electromagnetically Induced Transparency (EIT) system, where the EIT is "spoiled" by a third coherence that couples a fourth energy level into the ladder system. Traditionally, the lower transition is called the probe, and the upper transition is called the pump. The upper energy level of the ladder system is a Rydberg state, whose large electric dipole moment allows the third coherence to be established with an extremely weak RF field. The RF can be tuned to be near the resonance of another nearby Rydberg level. This forms a second EIT-like system nested inside the first system that modulates the absorption of the probe, which can be used to determine the strength of the microwave field.

In its simplest form, the Rydberg electrometer is an amplitude modulation (AM) RF field sensor. The amplitude of the RF modifies the absorption frequency of the probe beam, which is typically measured by measuring the beam intensity after passing through vapor in a vapor cell. If the RF field is a carrier frequency with amplitude modulation, the signal is both detected and brought to baseband by the Rydberg sensor, thus replacing both the antenna and the heterodyne front end of the radio receiver.

Without applying other techniques, the sensed RF field must be close to the resonance of an allowed Rydberg-to-Rydberg transition. The term "RF" includes frequencies from MHz to THz, but Rydberg sensors can also be used continuously down to a few kHz or even DC, with a loss in sensitivity when the sensed field is not near a resonance. Because of the large number of n and L states available in the Rydberg manifold, the Rydberg sensor has high sensitivity at hundreds of discrete frequencies over a huge bandwidth, without need for multiple front ends (antenna and heterodyne unit) to reach the entire range.

Further details of various embodiments are described hereafter with reference to the drawings.

FIG. 1A is a schematic diagram of a sensor system 10, according to one embodiment. The sensor system 10 includes a laser source 12 configured to emit a pump beam at a first wavelength and a probe beam at a second wavelength. A photonic integrated circuit 20, such as a photonic chip, is configured to receive the pump beam and probe beam from laser source 10. The photonic integrated circuit 20 includes an array of cascaded frequency shifters 22 operative to generate a plurality of substantially parallel light beams, each having a different frequency, from the pump beam and probe beam. The frequency shifters 22 are described in further detail hereafter.

An optical device 30 is configured to receive the light beams from photonic integrated circuit 20, and direct the light beams to a cell 40. In various embodiments, optical device 30 can be a lens configuration, a grating, an optical metamaterial, or the like.

In one example embodiment, cell 40 is a vapor cell containing alkali atoms such as rubidium (Rb) or cesium (Cs). The cell 40 is configured to allow passage of the light beams therethrough such that the atoms in cell 40 are excited to a manifold of Rydberg energy levels (e.g., principal quantum number, n, 30-100). A dichroic filter 50 is configured to receive the light beams passing through cell 40, and is operative to separate the pump beam light and probe beam light prior to detection.

A detector array 60 is configured to receive the light beams passed by dichroic filter 50. The detector array 60 includes a two-dimensional array of photosensors 62 configured to map out transmission of the respective light beams corresponding to the probe beam light through cell 40. The light beam data can be sent as output signals from detector array 60 to a processor for data analysis and subsequent display.

Figure 1B:
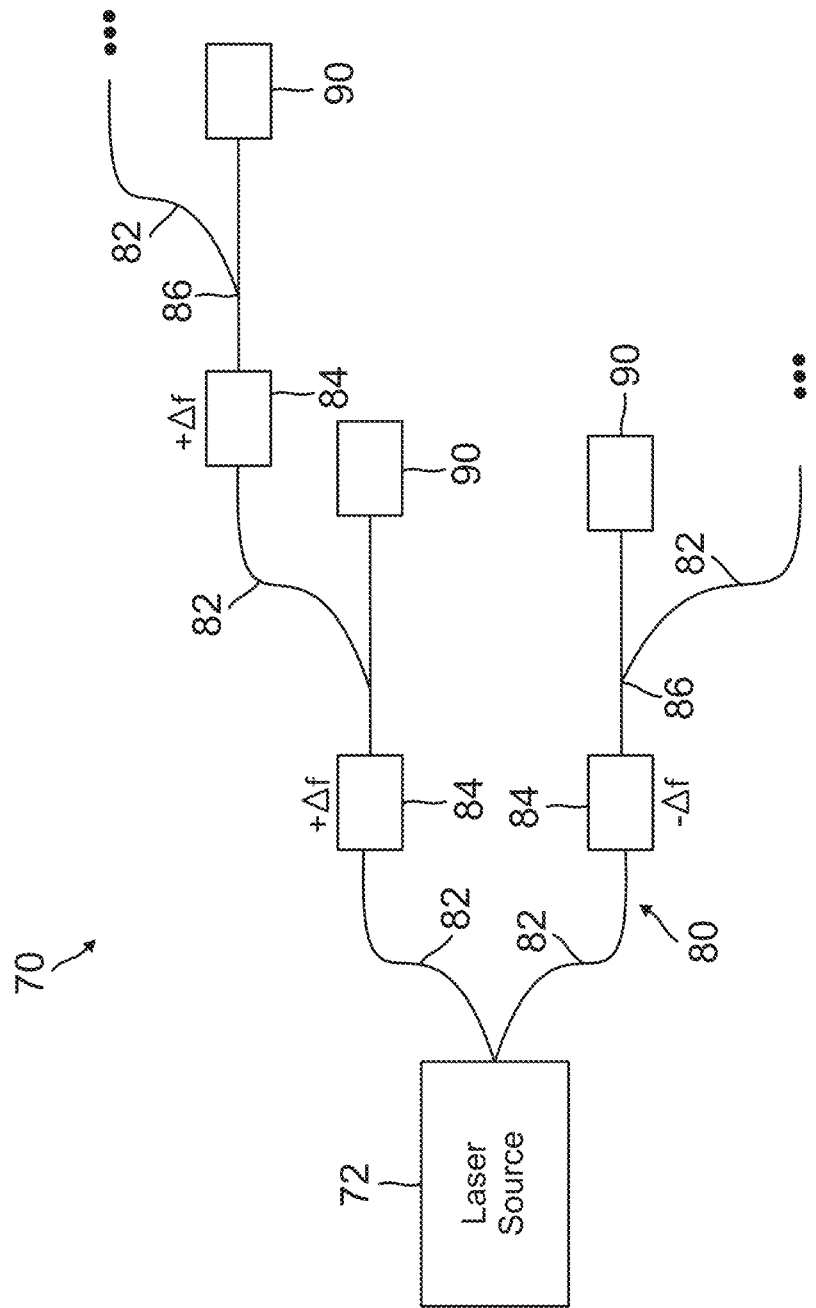
FIG. 1B is a schematic diagram of a sensor system, according to an alternative embodiment.

FIG. 1B is a schematic diagram of a sensor system 70, according to an alternative embodiment, which operates in a similar manner as sensor system 10 (FIG. 1A), except that the photonic chip is replaced with a fiber based arrangement. Accordingly, sensor system 70 includes a laser source 72 configured to emit a pump beam at a first wavelength and a probe beam at a second wavelength. An optical fiber based arrangement 80, which can be bundled in various configurations, is operative to receive the pump beam and probe beam from laser source 72. The fiber based arrangement 80 includes an array of cascaded optical fibers 82, which are connected with respective fiber coupled phase modulators 84 configured to provide frequency shifting, and fiber splitters 86.

Similar to the photonic chip described above, fiber based arrangement 80 is operative to generate a plurality of light beams, each having a different frequency, from the pump beam and probe beam. The light beams at each frequency are directed to a respective measurement vapor cell 90 connected to a respective optical fiber 82. A dichroic filter can be employed to receive the light beams passing through each vapor cell 90. The dichroic filter is operative to separate the pump beam light and probe beam light prior to detection. A detector array such as that described for sensor system 10 (FIG. 1A) can be employed to receive the light beams passed by the dichroic filter. The light beam data can be sent as output signals from the detector array to a processor for data analysis and subsequent display.

An advantage of using a fiber based sensor system as shown in FIG. 1B is the ready availability of fiber coupled phase modulators and other optical devices used in the system. Another advantage of the fiber based sensor system is the ability to have distinct measurement vapor cells that would not have some of the potential complications of cross coupling, etc. that a fully integrated system might have due to the close proximity of the sensing elements for different frequencies. However, the fiber based system could have a reduction in the possible number of modulator elements, and/or an increase in the size of the overall device compared to the integrated system.

Rydberg Spectrum Analyzer

Figure 2:
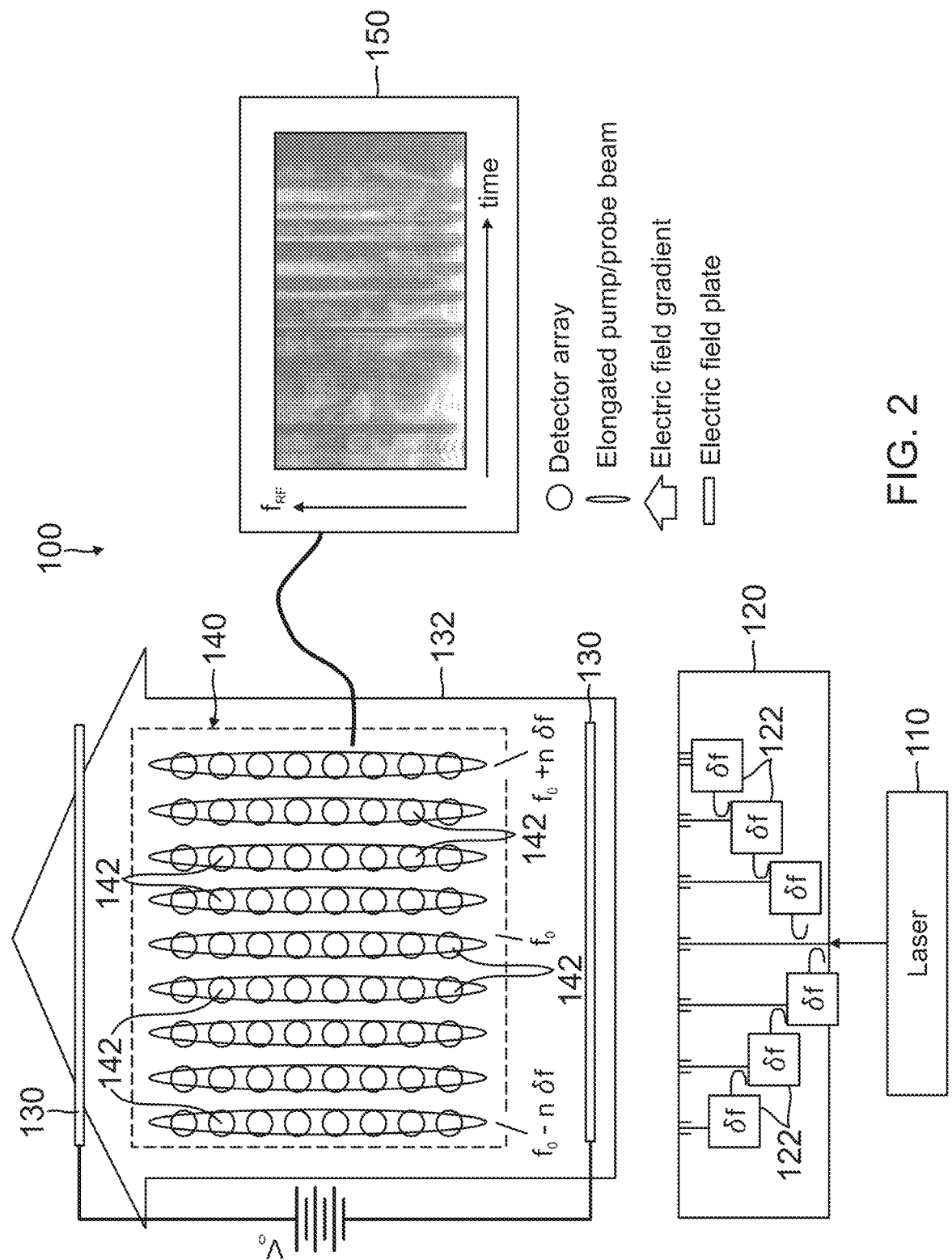
FIG. 2 is a schematic diagram of a sensor system implemented as a Rydberg spectrum analyzer, according to one embodiment.

FIG. 2 is a schematic diagram of a sensor system 100 implemented as a Rydberg spectrum analyzer, according to one embodiment. The sensor system 100 includes a laser source 110 configured to emit a pump beam and a probe beam, and a photonic chip 120 configured to receive the pump/probe beams from laser source 110. The photonic chip 120 includes an array of integrated frequency shifters 122 ($\delta f$) operative to generate a plurality of parallel pump/probe beams, each having a different frequency. The integrated frequency shifters 122 on photonic chip 120 are described in further detail hereafter.

The parallel pump/probe beams generated by photonic chip 120 are elongated/broadened by an optical device and are directed through a vapor cell having an electric field plate or plates 130 configured to produce an electric field gradient 132. A detector array 140, such as a charge coupled device (CCD), includes a two-dimensional array of photosensors 142 configured to map out transmission of the elongated/broadened pump/probe beams (e.g., $f_0 - n\,\delta f$, $f_0$, $f_0 + n\delta f$). A processor 150 is operative to acquire the beam data as output signals for data analysis and subsequent display (e.g., $f_{RF}$ v. time).

Figure 3:
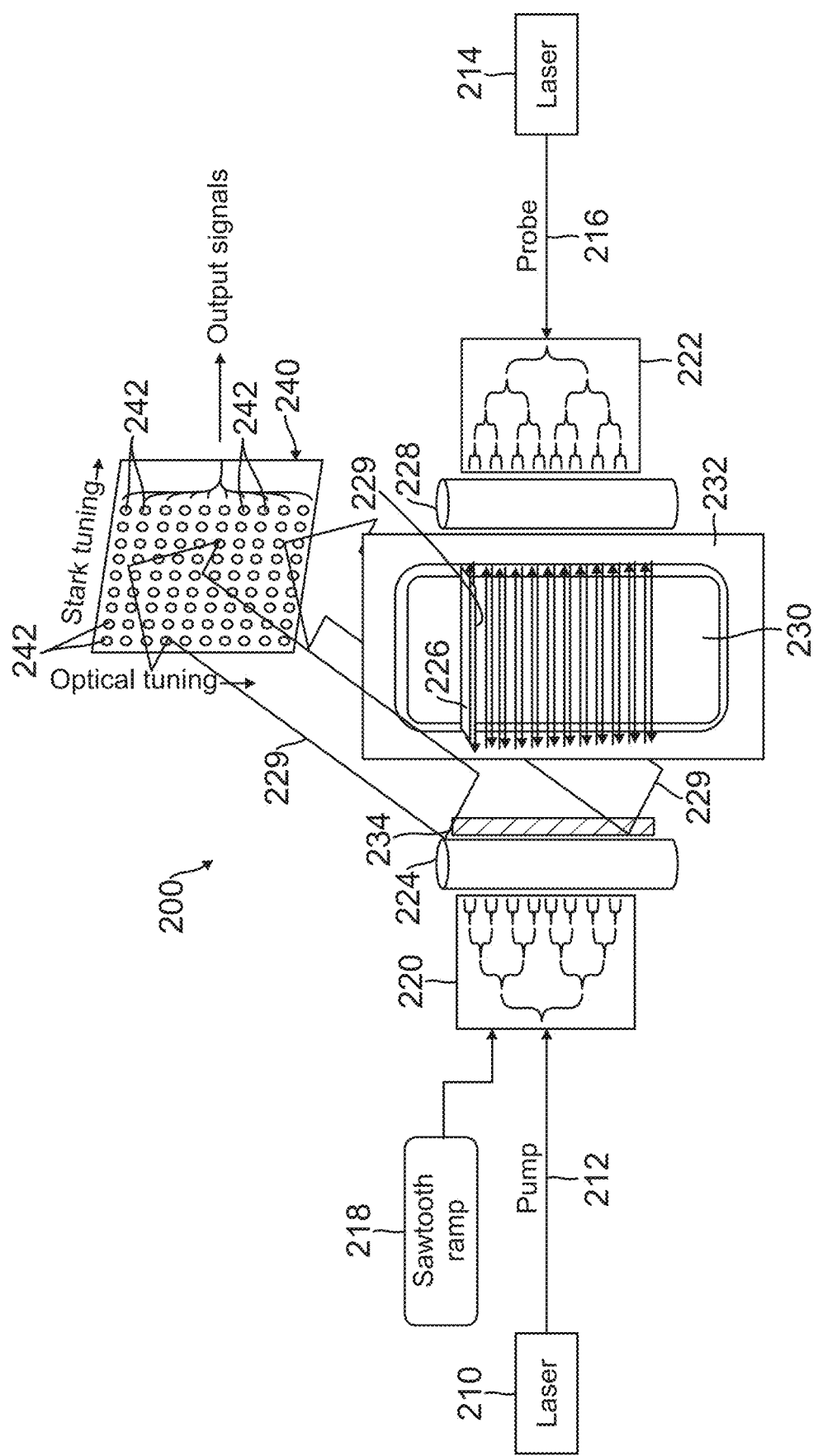
FIG. 3 is an example embodiment of a sensor system for rapid spectrum scanning, according to one implementation.

FIG. 3 illustrates an example embodiment of a sensor system 200 for rapid spectrum scanning, according to one implementation. The sensor system 200 includes a first laser device 210 configured to emit a pump beam 212 at a first wavelength (e.g., 480 nm, blue light), and a second laser device 214 configured to emit a counter-propagating probe beam 216 at a second wavelength (e.g., 780 nm, red light). An in-plane pump photonic chip 220 is configured to receive pump beam 212 from first laser device 210. An in-plane probe photonic chip 222 is configured to receive probe beam 216 from second laser device 214.

The pump photonic chip 220 includes an array of integrated frequency shifters operative to generate a plurality of substantially parallel beams, each having a different frequency, from pump beam 212. The photonic chip 220 can include a splitter/phase shifter array to propagate the light onto different layers of photonic chip 220. A modulation can be applied to the frequency shifters in order to modulate the laser beam with RF for heterodyne measurements, and a sawtooth ramp 218 (e.g., about 4 MHz) can be applied to photonic chip 220 in order to shift the frequency of the pump. The probe photonic chip 222 includes an array of splitters to generate a plurality of substantially parallel beams from counter-propagating probe beam 216, but does not have frequency shifters.

A first cylindrical lens system 224 is configured to receive the parallel beams from pump photonic chip 220, and to broaden each beam into respective out-of-plane light sheets 226. A second cylindrical lens system 228 is configured to receive the parallel beams from probe photonic chip 222 and broaden each of those beams into respective out-of-plane light sheets 229.

A vapor cell 230 is configured to receive the light sheets 226 and 229 respectively from cylindrical lens systems 224 and 228, and to allow passage of light sheets 226 and 229 therethrough. One or more electric field plates 232 is coupled to vapor cell 230 and is configured to produce an electric field (DC) gradient out of plane. An array of tilted dichroic mirrors 234 directs probe light (light sheets 229) toward a detector array 240.

The detector array 240 includes a two-dimensional array of photosensors 242 configured to map out transmission of light sheets 226 and 229 along two axes from vapor cell 230. The detector array 240 can be a CCD chip, or a custom array of photodiodes with appropriate spacing. The detector array 240 can be implemented to have discrete 100 MHz steps (Stark tuning) along one dimension, and along the other dimension, the 100 MHz can be divided into smaller frequency steps (optical tuning). Electrical output signals from detector array 240 are then sent to a processor for data analysis and display.

Figure 4:
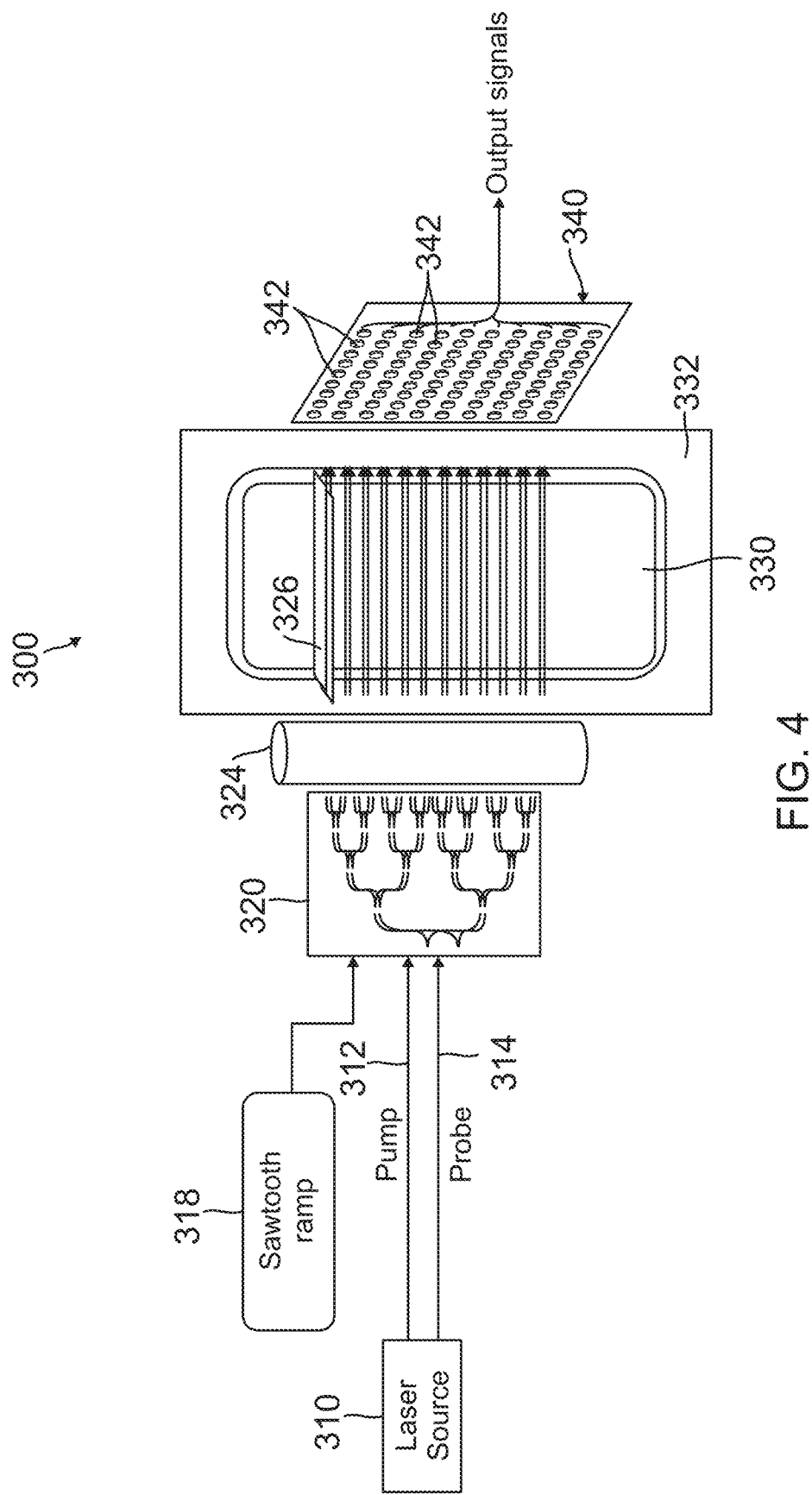
FIG. 4 is an example embodiment of a sensor system for rapid spectrum scanning, according to another implementation.

FIG. 4 is an example embodiment of a sensor system 300 for rapid spectrum scanning, according to another implementation. The sensor system 300 includes a laser source 310 configured to emit a pump beam 312 at a first wavelength (e.g., 480 nm, blue light) and a co-propagating probe beam 314 at a second wavelength (e.g., 780 nm, red light). An in-plane photonic chip 320 is configured to receive pump beam 312 and probe beam 314 from laser source 310.

The photonic chip 320 includes an array of integrated frequency shifters operative to generate a plurality of parallel beams, each having a different frequency, from pump beam 312 and probe beam 314. The photonic chip 320 can include a splitter and phase shifter array to co-propagate the two colors of light onto different layers of photonic chip 220, or to co-propagate the light in the same wideband waveguides. A sawtooth ramp 318 (e.g., about 4 MHz) can be applied to photonic chip 320.

A cylindrical lens system 324 is configured to receive the parallel beams from photonic chip 320 and broaden each beam into respective out of plane light sheets 326. A vapor cell 330 is configured to receive light sheets 326 from cylindrical lens system 324 and to allow passage of light sheets 326 therethrough. One or more electric field plates 332 is coupled to vapor cell 330 and is configured to produce an electric field (DC) gradient out of plane. A dichroic filter or coating separates pump light and probe light so that only the probe light of light sheets 326 is passed to a detector array 340. In one embodiment, the dichroic filter or coating can be formed on a light receiving surface of detector array 340.

The detector array 340 includes a two-dimensional array of photosensors 342 configured to map out transmission of light sheets 326 along two axes from vapor cell 330. The detector array 340 can be a CCD chip, or a custom array of photodiodes with appropriate spacing. The detector array 340 can be implemented to have discrete 100 MHz steps along one dimension, and along the other dimension, the 100 MHz can be divided into smaller frequency steps. Electrical output signals from detector array 340 are then sent to a processor for data analysis and display.

In one example of a sensor array implemented according to the present approach, a vapor cell is provided with 200 pump/probe beams addressing different Rydberg states, each 100 MHz apart. This sensor array can span 20 GHz of spectrum with 100 MHz granularity. A field gradient provides a 100 MHz difference in Stark shift over the dimension of the sensor array. With a 200×200 array of photosensors, each 100 MHz of spectrum is sensed in 500 kHz bands.

Increased frequency resolution can be added by slightly dithering the applied DC electric field to scan across the 500 kHz span, at the cost of decreased time resolution. For example, a 1 kHz dither can be applied, allowing the device to sense at the 100 µV/cm level for 1 ms every 500 Hz, thus obtaining 20 GHz of bandwidth information with 500 Hz resolution in 1 second.

Rydberg Applications Using Photonic Integration

Photonic integration has been used to enable miniaturization of laser-based sensors for ring-laser gyroscopes, Light Detection and Ranging (LiDAR), and cold-atom clocks. Enabling technologies such as couplers, gratings, intra-layer (vertical) couplers, phased arrays, phase shifters, and the like, can be employed to produce massively parallel Rydberg sensors.

The basic idea of the massively parallel sensor is to use a vapor cell with many laser beams (e.g., hundreds of beams) passing therethrough, with each beam tuned to a specific Rydberg level in the pump/probe configuration. A two-dimensional array of photodiodes measures the absorption of each probe (initially low, due to EIT). Each of these probes is sensitive to a set of RF frequencies.

Typically, a Rydberg sensor is arranged in a Doppler-free configuration (counter-propagating pump and probe) for higher sensitivity, as in the example embodiment of FIG. 3. In the alternative approach of FIG. 4, it has been determined that for a penalty of only a factor of two in sensitivity, a co-propagating configuration can be used as a way to simplify the sensor, and especially its alignment.

In one implementation, an array of laser beams is created from one input laser using phase shifters in a photonic integrated circuit. A model of the performance of an array of 200 lithium niobate ($LiNbO_3$) phase shifters shows that they can be cascaded to produce up to about 144 MHz frequency shift in each stage. Thus, the present approach can achieve up to about 28 GHz of addressable laser wavelength in about 0.5 mm×0.5 mm of space on a photonic chip.

Figure 5:
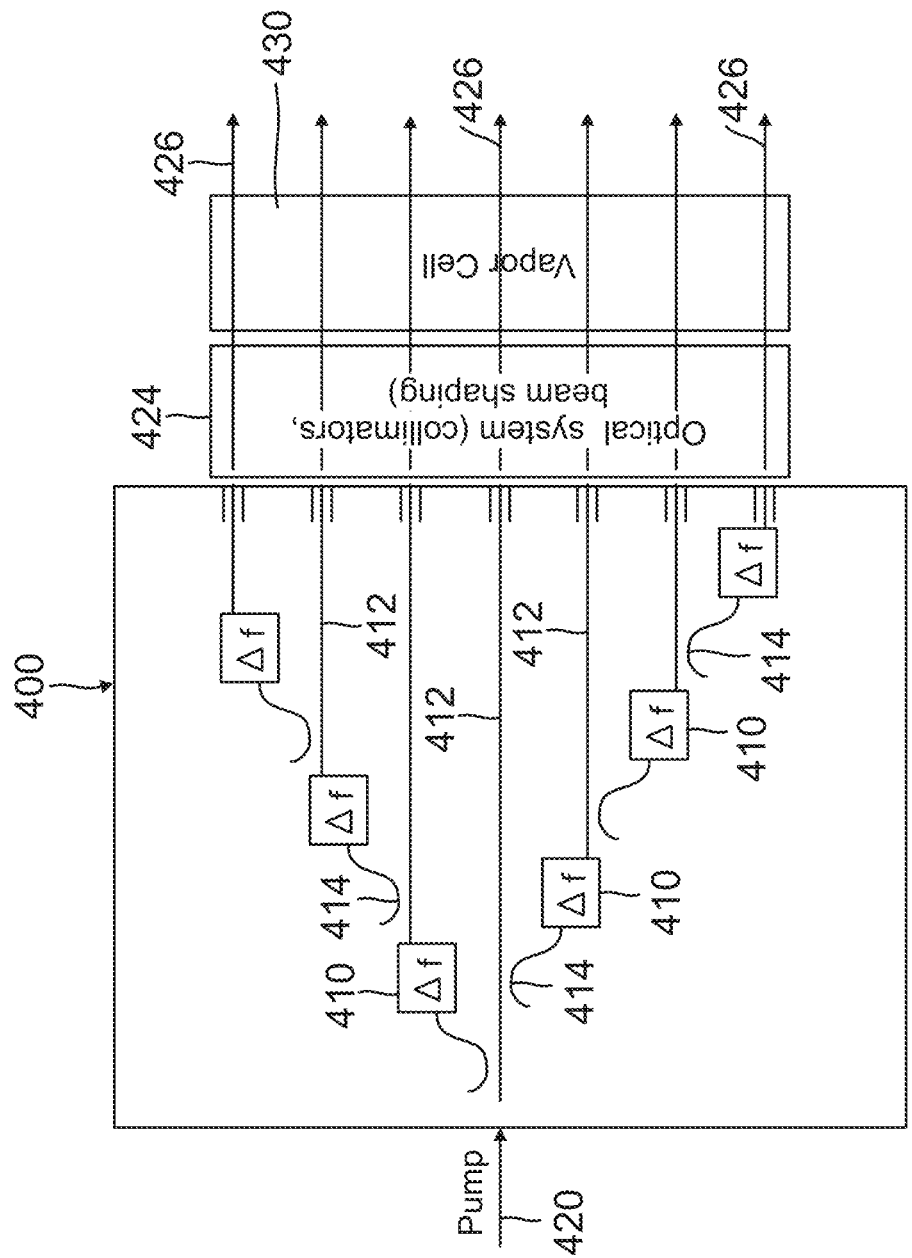
FIG. 5 is a schematic diagram of a subsection of a photonic chip having a plurality of cascaded frequency shifters, according to one embodiment.

FIG. 5 is a schematic diagram of a small subsection of a photonic chip 400 having a plurality of frequency shifters 410, according to one embodiment. The frequency shifters 410 are in a cascaded arrangement through a plurality of integrated waveguides 412 and waveguide couplers 414. The frequency shifters 410 operate by rapidly chirping the phase of a pump optical wave front 420 from a laser source. This is done by employing the electro-optic effect in one or more low-Q optical resonators. The resonators are used to enhance the phase shift available from a given electro-optic coefficient.

A voltage corresponding to a sawtooth waveform is applied across a constituent waveguide in photonic chip 400, and the constant time derivative of optical phase equates to a change in frequency. Measurements are made during the phase ramp (at constant frequency) and paused during the reset time of the sawtooth ramp. For example, with a 4 MHz, 20 $V_{p-p}$ ramp driving the phase shifters, a 9e8 rad/second of phase ramp can be achieved, corresponding to a 144 MHz frequency shift.

An optical system 424 is configured to receive parallel beams 426 from photonic chip 400. The optical system 424 includes collimators and beam shaping optics to broaden or otherwise shape each of beams 426. A vapor cell 430 is configured to receive beams 426 from optical system 424 and to allow passage of beams 426 therethrough, such as described previously.

Figure 6A:
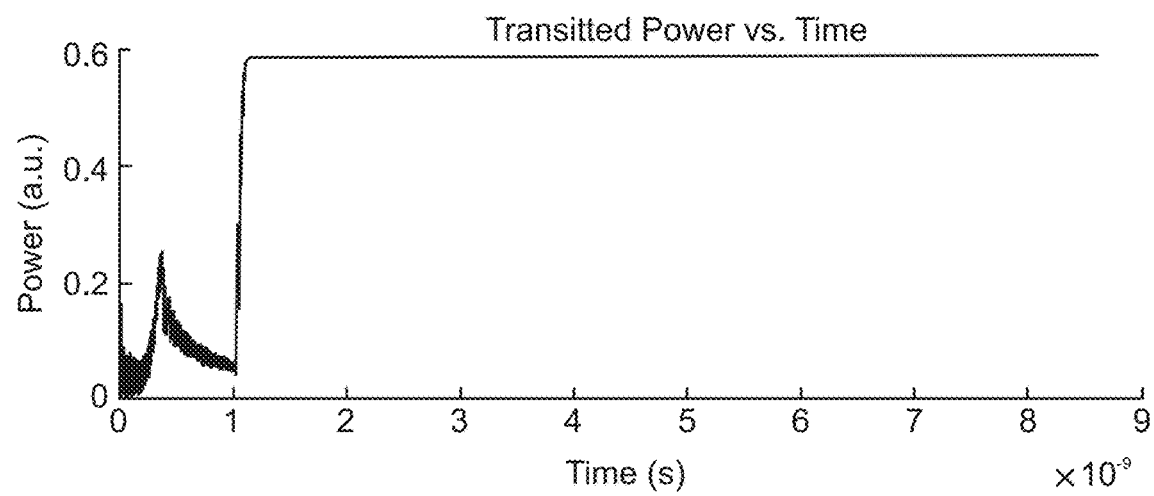
FIGS. 6A and 6B are graphs respectively showing stability of transmitted power and linearity of a phase ramp in model calculations of a single frequency shifter.
Figure 6B:
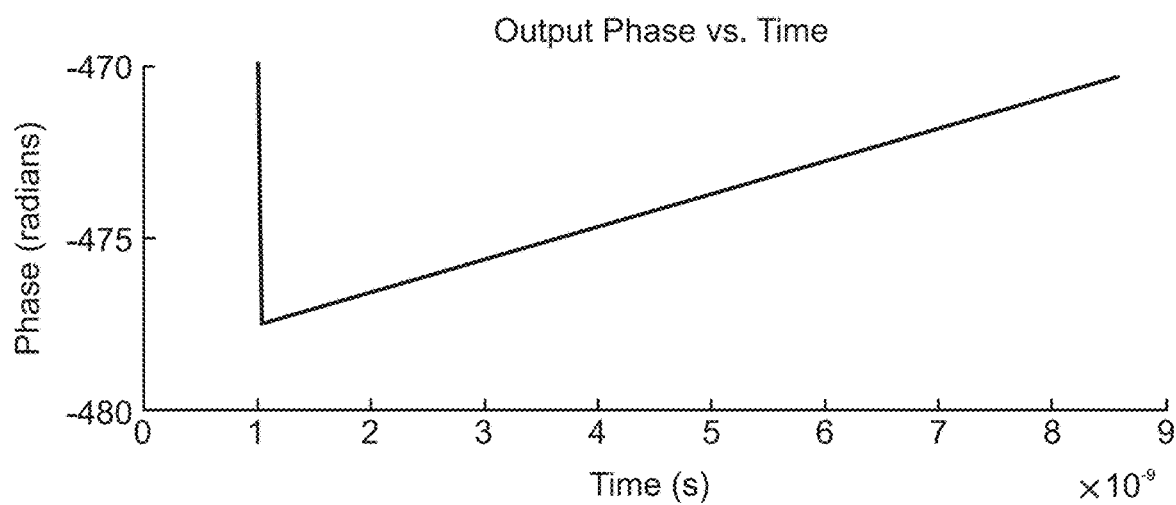

FIGS. 6A and 6B are graphs respectively showing the stability of the transmitted power and linearity of the phase ramp in model calculations of a single frequency shifter. FIG. 6A depicts the transmitted power (a.u.) with respect to time (ns), and FIG. 6B depicts the output phase (radians) with respect to time (ns). The instability in transmitted power during the first nanosecond of operation (FIG. 6A) is a result of the time it takes light to propagate from the input of the device to the output, and is not detrimental to performance. For even larger frequency shifts, a coupled-cavity approach can be used.

The "ladder" EIT configuration requires that the pump (blue) beam (480 nm, in the case of Rb) be tuned to the Rydberg level, while the probe beam remains substantially close to resonance with the intermediate state. Thus, the photonic phase shifters are operating on the blue light. Since ultra-low loss waveguides are not as advanced in the blue as in the red, a relatively high loss coefficient of 30 dB/m is assumed. Thus, about a 60% transmission of light through an array of 200 phase shifters can be predicted. The coupling ratio of the splitters is arranged to make the outputs at each frequency equal, given the propagation loss to each output.

For a co-propagating Doppler configuration, a single photonic chip can be used having photonic-integrated phase shifters, splitters, and outputs for the pump (e.g., 480 nm or 508 nm) and probe (e.g., 780 nm or 852 nm) beams, with a detector sensor array on the opposite side of a vapor cell (see e.g., FIG. 4). For a counter-propagating Doppler-free configuration, a separate chip can be used with splitters for the D2 probe beam (see e.g., FIG. 3), and a pump output chip has receivers for the transmitted probe beam; or a single chip can be used, with a hole or other gap in the middle to allow insertion of the vapor cell.

Fast Spectrum Searching

Fast spectrum searches are used in electronic warfare to detect narrow-band or frequency-agile signals of unknown origin within a wide band of the RF spectrum. The state-of-the-art in fast spectrum searching is represented by systems in which RF signals of interest are written onto an optical carrier by an electro-optic modulator, and subsequently detected via optical hole-burning in atom-like dopants in a cryogenically cooled crystal. These systems demonstrate the ability to acquire fast (less than 1 ms) snapshots of broad (greater than 10 GHz) swaths of the RF spectrum, with resolution bandwidth of about 1 MHz, but are not suitable for low size, weight, and power (SWaP) applications due to cryogenic requirements. The current non-cryogenic alternative reaches 10 GHz of spectrum using 10 Gbit analog-to-digital (A/D) converters with massively parallel computing to rapidly perform the required signal analysis.

The present approach provides a competitive level of RF situational awareness, in a lower size, weight, and power (SWaP) format, and without the cryogenic requirement, using a large number of parallel Rydberg sensors operating simultaneously.

The present sensor system can used to continuously map about a 20 GHz swath of the RF spectrum with an array of Rydberg probes each tuned to a discrete span (e.g., about 100 MHz) along the RF spectrum, and continuously tunable within that (100 MHz) span. Each transition can be continuously tuned by 100 MHz with the application of a less than 1 V/cm electric field.

Ultra-Wide Bandwidth Communication

The properties of Rydberg sensors are also aligned with the needs of ultra-wide bandwidth (UWB) communication. In simplest form, UWB signals are "delta-function" pulses (typically about 1 μs in practice) in which the shortness of the pulse spreads the RF energy over a wide spectrum. Thus, there is very little energy at any particular frequency. Communication can be established by applying an encoding scheme on top of the UWB signals.

Detection of RF pulses with 1 μs duration, using Rydberg atoms arranged to measure a single frequency, has been demonstrated, where the pulse shape was determined with 10 ns resolution, suggesting that detection of even shorter pulses is possible if desired. Beneficial properties of a UWB sensor are high sensitivity to low RF power and the ability to sense over the entire Fourier bandwidth of the short pulse simultaneously without additional equipment.

The highly parallel photonic-integrated sensor, as described herein, can work well as a sensor for UWB. The RF carrier and Rydberg levels are selected such that a resonance is available for the RF carrier and many of its odd harmonics. The sensor uses parallel optical beams to simultaneously probe each of those levels. A UWB pulse is sensed on all components of the parallel array simultaneously. Small signals are available to the detector array by virtue of the sensitivity of the Rydberg atoms, and the signal-to-noise ratio (S/N) is further enhanced by looking for correlations in the signals of each of the array's outputs. For this application, an array with a single dimension can be used.

Figure 7:
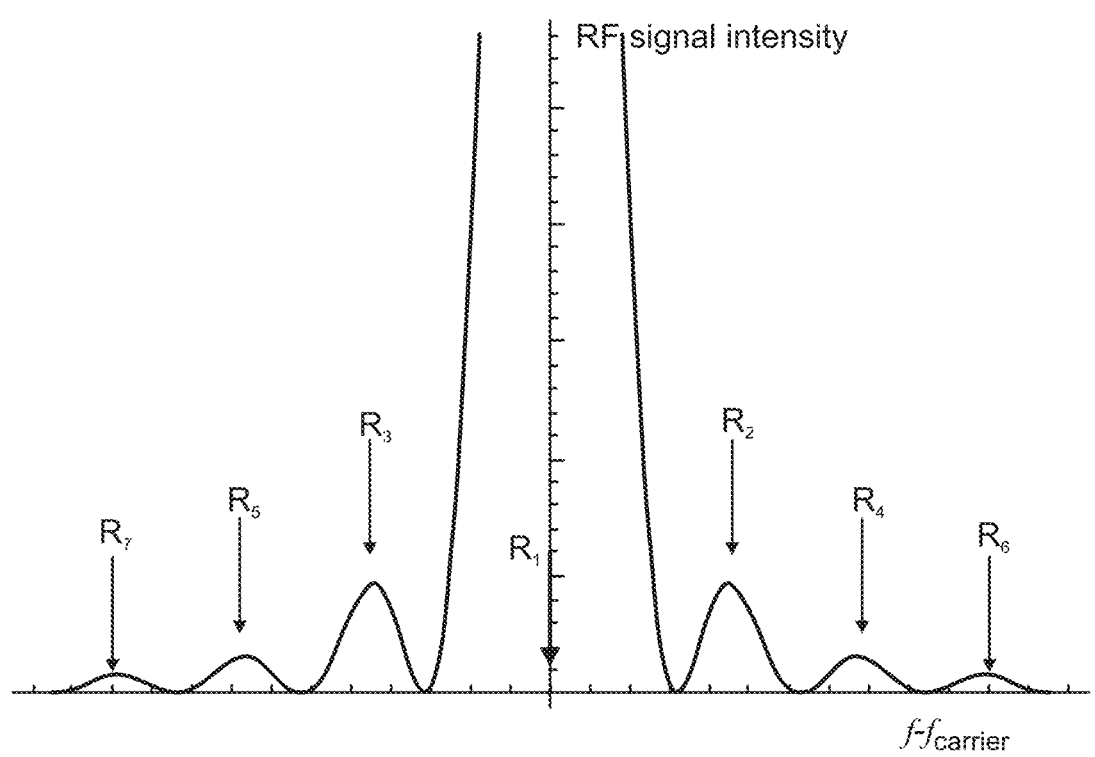
FIG. 7 is a graphical representation of a spectrum of a square ultra-wide bandwidth pulse, in which a set of seven Rydberg sensors are designed to sense the pulse.

FIG. 7 is a graphical representation of a spectrum of a square UWB pulse, in which a set of seven Rydberg sensors ($R_1$ to $R_7$) are designed to sense the UWB pulse. FIG. 7 depicts the RF signal intensity detected by the Rydberg sensors with respect to a carrier frequency (f-$f_{carrier}$).

Figure 8:
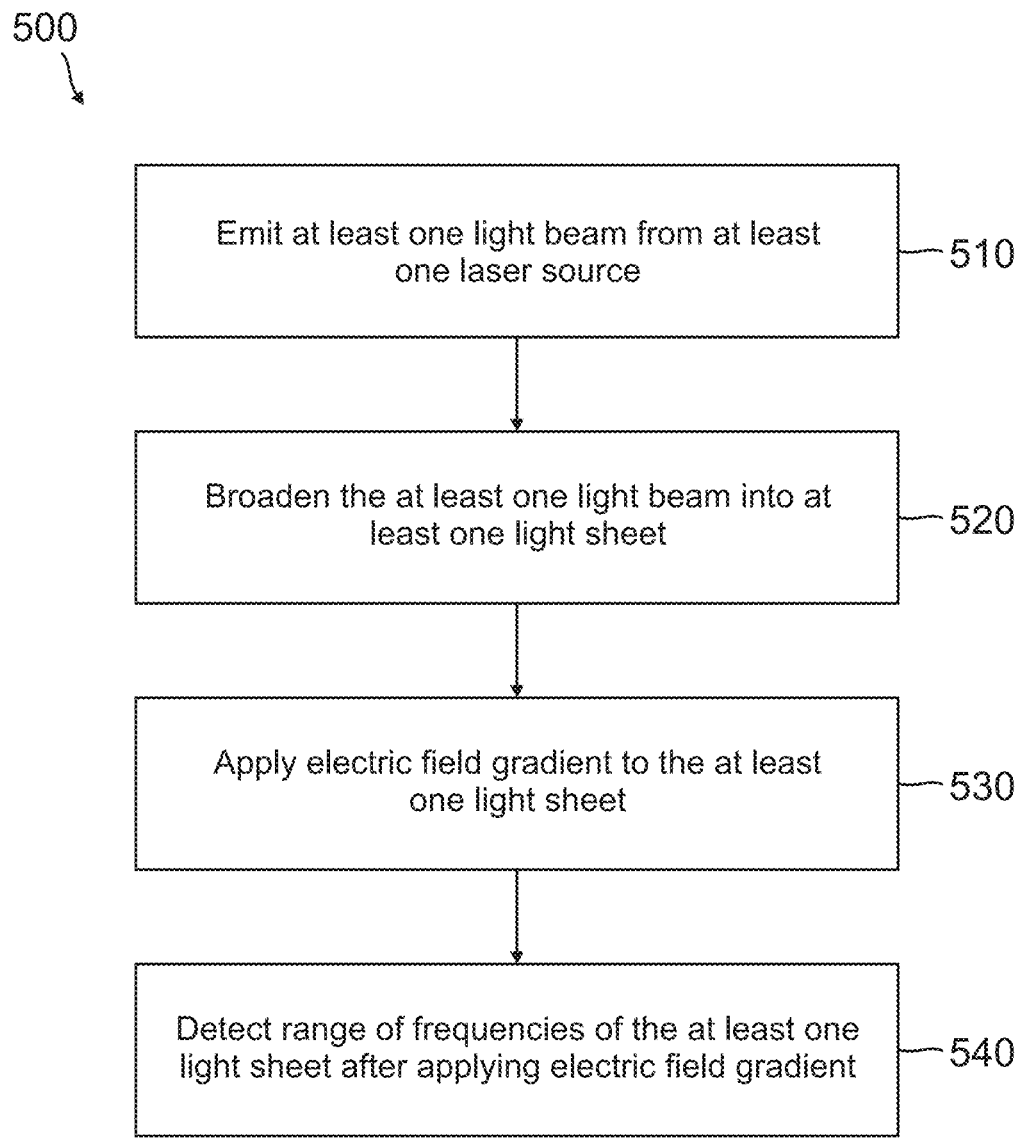
FIG. 8 is a flow diagram of a sensing method, according to one implementation.

FIG. 8 is a flow diagram for a sensing method 500 according to one implementation. Initially, method 500 emits at least one light beam from at least one laser source (block 510), and broadens the at least one light beam into at least one light sheet (block 520). The method 500 then applies an electric field gradient to the at least one light sheet (block 530), and detects a range of frequencies of the at least one light sheet after applying the electric field gradient (block 540).

The method 500 can be implemented using the various embodiments described previously. For example, a plurality of substantially parallel light beams, each having a different frequency, can be generated from the at least one light beam using a photonic chip. In addition, the at least one light sheet can be directed through a vapor cell having the electric field gradient.

EXAMPLE EMBODIMENTS

Example 1 includes a sensor system, comprising: a laser source configured to emit a pump beam at a first wavelength and a probe beam at a second wavelength; optical means for receiving the pump beam and the probe beam from the laser source, the optical means operative to generate a plurality of light beams, each having a different frequency, from the pump beam and the probe beam; one or more cells configured to receive one or more of the light beams from the optical means and to allow passage of the one or more light beams therethrough, the one or more cells containing a plurality of alkali atoms; a dichroic filter configured to receive the one or more light beams from the one or more cells, the dichroic filter operative to separate pump beam light and probe beam light from the one or more light beams; and a detector array configured to receive the probe beam light from the dichroic filter, the detector array including a two-dimensional array of photosensors operative to map out transmission of respective light beams corresponding to the probe beam light through the one or more cells.

Example 2 includes the sensor system of Example 1, wherein: the pump beam co-propagates with the probe beam; and the first wavelength of the pump beam produces blue light, and the second wavelength of the probe beam produces red light.

Example 3 includes the sensor system of any of Examples 1-2, wherein the optical means comprises a photonic integrated circuit configured to receive the pump beam and the probe beam, the photonic integrated circuit including an array of cascaded frequency shifters operative to generate the plurality of light beams, each having a different frequency, from the pump beam and the probe beam.

Example 4 includes the sensor system of Example 3, wherein the frequency shifters are in a cascaded arrangement on the photonic integrated circuit through a plurality of integrated waveguides and waveguide couplers.

Example 5 includes the sensor system of Example 4, wherein the photonic integrated circuit includes a splitter and phase shifter array configured to co-propagate the pump beam and the probe beam onto different layers of the photonic integrated circuit, or to co-propagate the pump beam and the probe beam in the same wideband waveguides.

Example 6 includes the sensor system of any of Examples 3-5, further comprising: an optical device configured to receive the light beams from the photonic integrated circuit, wherein the optical device is configured to deliver respective light beams to the one or more cells.

Example 7 includes the sensor system of Example 6, wherein the optical device comprises a cylindrical lens system configured to broaden the light beams into respective light sheets.

Example 8 includes the sensor system of any of Examples 1-2, wherein the optical means comprises an optical fiber based arrangement configured to receive the pump beam and probe beam, the fiber based arrangement including an array of cascaded optical fibers, which are connected with respective fiber coupled phase modulators operative to generate the plurality of light beams, each having a different frequency, from the pump beam and the probe beam.

Example 9 includes the sensor system of any of Examples 1-8, wherein the alkali atoms in the one or more cells are excitable to a manifold of Rydberg energy levels by the light beams.

Example 10 includes the sensor system of any of Examples 1-9, wherein the one or more cells comprise one or more vapor cells, and the alkali atoms comprise rubidium or cesium.

Example 11 includes the sensor system of any of Examples 1-10, further comprising: one or more electric field plates coupled to the one or more cells and configured to produce an electric field gradient.

Example 12 includes the sensor system of any of Examples 1-11, further comprising: a processor operative to acquire output signals from the detector array for data analysis and subsequent display.

Example 13 includes the sensor system of any of Examples 1-12, wherein the system is implemented as a Rydberg spectrum analyzer that includes an array of Rydberg probes.

Example 14 includes the sensor system of Example 13, wherein the system is operative to continuously map a span of about 20 GHz of radio-frequency (RF) spectrum, with each Rydberg probe tuned to a slightly different RF frequency.

Example 15 includes the sensor system of Example 14, wherein each Rydberg probe is operative to span about 100 MHz along the RF spectrum, and is further tunable within the 100 MHz span.

Example 16 includes the sensor system of any of Examples 1-15, wherein the system is operative for ultra-wide bandwidth (UWB) communication, or rapid spectrum scanning.

Example 17 includes a sensor system, comprising: a first laser device configured to emit a pump beam at a first wavelength; a second laser device configured to emit a counter-propagating probe beam at a second wavelength; a first photonic chip configured to receive the pump beam from the first laser device, the first photonic chip including an array of cascaded frequency shifters operative to generate a plurality of substantially parallel pump beams, each having a different frequency, from the pump beam; a second photonic chip configured to receive the probe beam from the second laser device, the second photonic chip including an array of splitters operative to generate a plurality of substantially parallel probe beams from the probe beam; a first optical device configured to receive the pump beams from the first photonic chip, wherein the first optical device is configured to broaden each of the pump beams into respective pump light sheets; a second optical device configured to receive the probe beams from the second photonic chip, wherein the second optical device is configured to broaden each of the probe beams into respective probe light sheets; a vapor cell configured to receive the pump light sheets from the first optical device and the probe light sheets from the second optical device, the vapor cell containing a plurality of alkali atoms; one or more electric field plates coupled to the vapor cell and configured to produce an electric field gradient; a dichroic mirror array configured to reflect the probe light sheets that pass through the vapor cell; and a detector array configured to receive the probe light sheets from the dichroic mirror array, the detector array including a two-dimensional array of photosensors operative to map out transmission of the probe light sheets along two axes from the vapor cell.

Example 18 includes the sensor system of Example 17, wherein: a sawtooth ramp is applied to the first photonic chip; and the detector array is configured to provide Stark tuning along one dimension and optical tuning along the other dimension.

Example 19 includes a method comprising: emitting at least one light beam from at least one laser source; broadening the at least one light beam into at least one light sheet; applying an electric field gradient to the at least one light sheet; and detecting a range of frequencies of the at least one light sheet after applying the electric field gradient.

Example 20 includes the method of Example 19, further comprising: generating a plurality of substantially parallel light beams, each having a different frequency, from the at least one light beam in a photonic chip; and directing the at least one light sheet through a vapor cell having the electric field gradient.

From the foregoing, it will be appreciated that, although specific embodiments have been described herein for purposes of illustration, various modifications may be made without deviating from the scope of the disclosure. Thus, the described embodiments are to be considered in all respects only as illustrative and not restrictive. In addition, all changes that come within the meaning and range of equivalency of the claims are to be embraced within their scope.

What is claimed is:

1. A sensor system, comprising:
   a laser source configured to emit a pump beam at a first wavelength and a probe beam at a second wavelength;
   optical means for receiving the pump beam and the probe beam from the laser source, the optical means operative to generate a plurality of light beams, each having a different frequency, from the pump beam and the probe beam;
   one or more cells configured to receive one or more of the light beams from the optical means and to allow passage of the one or more of the light beams therethrough, the one or more cells containing a plurality of alkali atoms, wherein the alkali atoms in the one or more cells are excitable to a manifold of Rydberg energy levels by the one or more of the light beams;
   a dichroic filter configured to receive the one or more of the light beams from the one or more cells, the dichroic filter operative to separate pump beam light and probe beam light from the one or more of the light beams; and
   a detector array configured to receive the probe beam light from the dichroic filter, the detector array including a two-dimensional array of photosensors operative to map out transmission of respective light beams corresponding to the probe beam light through the one or more cells.

2. The sensor system of claim 1, wherein:
   the pump beam co-propagates with the probe beam; and
   the first wavelength of the pump beam produces blue light, and the second wavelength of the probe beam produces red light.

3. The sensor system of claim 1, wherein the optical means comprises a photonic integrated circuit configured to receive the pump beam and the probe beam, the photonic integrated circuit including an array of cascaded frequency shifters operative to generate the plurality of light beams, each having a different frequency, from the pump beam and the probe beam.

4. The sensor system of claim 3, wherein the frequency shifters are in a cascaded arrangement on the photonic integrated circuit through a plurality of integrated waveguides and waveguide couplers.

5. The sensor system of claim 4, wherein the photonic integrated circuit includes a splitter and phase shifter array configured to co-propagate the pump beam and the probe beam onto different layers of the photonic integrated circuit, or to co-propagate the pump beam and the probe beam in the same wideband waveguides.

6. The sensor system of claim 3, further comprising:
   an optical device configured to receive the light beams from the photonic integrated circuit, wherein the optical device is configured to deliver respective light beams to the one or more cells.

7. The sensor system of claim 6, wherein the optical device comprises a cylindrical lens system configured to broaden the light beams into respective light sheets.

8. The sensor system of claim 1, wherein the optical means comprises an optical fiber based arrangement configured to receive the pump beam and probe beam, the fiber based arrangement including an array of cascaded optical fibers, which are connected with respective fiber coupled phase modulators operative to generate the plurality of light beams, each having a different frequency, from the pump beam and the probe beam.

9. The sensor system of claim 1, wherein the one or more cells comprise one or more vapor cells, and the alkali atoms comprise rubidium or cesium.

10. The sensor system of claim 1, further comprising:
    one or more electric field plates coupled to the one or more cells and configured to produce an electric field gradient.

11. The sensor system of claim 1, further comprising:
    a processor operative to acquire output signals from the detector array for data analysis and subsequent display.

12. The sensor system of claim 1, wherein the system is implemented as a Rydberg spectrum analyzer that includes an array of Rydberg probes.

13. The sensor system of claim 12, wherein the system is operative to continuously map a span of about 20 GHz of radio-frequency (RF) spectrum, with each Rydberg probe tuned to a slightly different RF frequency.

14. The sensor system of claim 13, wherein each Rydberg probe is operative to span about 100 MHz along the RF spectrum, and is further tunable within the 100 MHz span.

15. The sensor system of claim 1, wherein the system is operative for ultra-wide bandwidth (UWB) communication, or rapid spectrum scanning.

16. A sensor system, comprising:
    a first laser device configured to emit a pump beam at a first wavelength;
    a second laser device configured to emit a counter-propagating probe beam at a second wavelength;
    a first photonic chip configured to receive the pump beam from the first laser device, the first photonic chip including an array of cascaded frequency shifters operative to generate a plurality of substantially parallel pump beams, each having a different frequency, from the pump beam;
    a second photonic chip configured to receive the probe beam from the second laser device, the second photonic chip including an array of splitters operative to generate a plurality of substantially parallel probe beams from the probe beam;
    a first optical device configured to receive the pump beams from the first photonic chip, wherein the first optical device is configured to broaden each of the pump beams into respective pump light sheets;
a second optical device configured to receive the probe beams from the second photonic chip, wherein the second optical device is configured to broaden each of the probe beams into respective probe light sheets;
a vapor cell configured to receive the pump light sheets from the first optical device and the probe light sheets from the second optical device, the vapor cell containing a plurality of alkali atoms;
one or more electric field plates coupled to the vapor cell and configured to produce an electric field gradient;
a dichroic mirror array configured to reflect the probe light sheets that pass through the vapor cell; and
a detector array configured to receive the probe light sheets from the dichroic mirror array, the detector array including a two-dimensional array of photosensors operative to map out transmission of the probe light sheets along two axes from the vapor cell.

17. The sensor system of claim 16, wherein:
a sawtooth ramp is applied to the first photonic chip; and
the detector array is configured to provide Stark tuning along one dimension and optical tuning along the other dimension.

18. A method comprising:
emitting at least one light beam from at least one laser source;
broadening the at least one light beam into at least one light sheet;
applying an electric field gradient to the at least one light sheet; and
detecting a range of frequencies of the at least one light sheet after applying the electric field gradient;
wherein a plurality of substantially parallel light beams, each having a different frequency, is generated from the at least one light beam in a photonic chip;
wherein the at least one light sheet is directed through a vapor cell having the electric field gradient.

* * * * *